(12) United States Patent
Auffray et al.

(10) Patent No.: US 6,178,321 B1
(45) Date of Patent: Jan. 23, 2001

(54) TELEPHONE SYSTEM COMPRISING A BASE STATION AND AT LEAST ONE HANDSET, METHOD IMPLEMENTED IN SUCH A SYSTEM, SUBSCRIBER STATION AND BASE STATION SUITABLE FOR SUCH A SYSTEM

(75) Inventors: Michel Auffray, Le Mans; Yannick Le Nue, Change, both of (FR)

(73) Assignee: U.S. Philips Corporation, New York, NY (US)

( * ) Notice: Under 35 U.S.C. 154(b), the term of this patent shall be extended for 0 days.

(21) Appl. No.: 09/158,625

(22) Filed: Sep. 22, 1998

(30) Foreign Application Priority Data

Sep. 23, 1997 (FR) .................................................. 9711830

(51) Int. Cl.$^7$ .................................................. H04B 1/00
(52) U.S. Cl. .......................................... 455/403; 455/462
(58) Field of Search .................................. 455/411, 462, 455/67.6, 212, 218, 219, 223

(56) References Cited

U.S. PATENT DOCUMENTS

| 4,663,765 | * | 5/1987 | Stuphin et al. | ...................... 375/114 |
| 4,689,812 | * | 8/1987 | Hata | ...................... 455/462 |
| 5,151,922 | * | 9/1992 | Weis | ...................... 375/5 |
| 5,553,077 | * | 9/1996 | Martinez Garcia et al. | ...................... 455/67.6 |
| 6,055,416 | * | 4/2000 | Hachimura | ...................... 455/218 |

* cited by examiner

Primary Examiner—Reinhard J. Eisenzopf
Assistant Examiner—Makoto Aoki
(74) Attorney, Agent, or Firm—Dicran Halajian

(57) ABSTRACT

An wireless communication system has a master station and a slave station. The master and slave stations exchange identification signals and call signals, and include a cut-off unit for cutting off the call signals during reception of the identification signals. The cut-off unit of the master station generates a master cut-off signal after transmission of a master identification signal to the slave station. The slave station transmits to the master station a slave identification signal in response to reception of the master identification signal so that the master cut-off signal is aligned with the slave identification signal received by the master station. The cut-off unit of the slave station generates a slave cut-off signal for alignment with the reception of the master identification signal. The slave station includes a differential circuit and a correction circuit. The differential circuit measures a time interval between the slave cut-off signal and the master identification signal received by the slave station. The correction circuit changes the slave cut-off signal as a function of the time interval to provide the alignment.

7 Claims, 3 Drawing Sheets

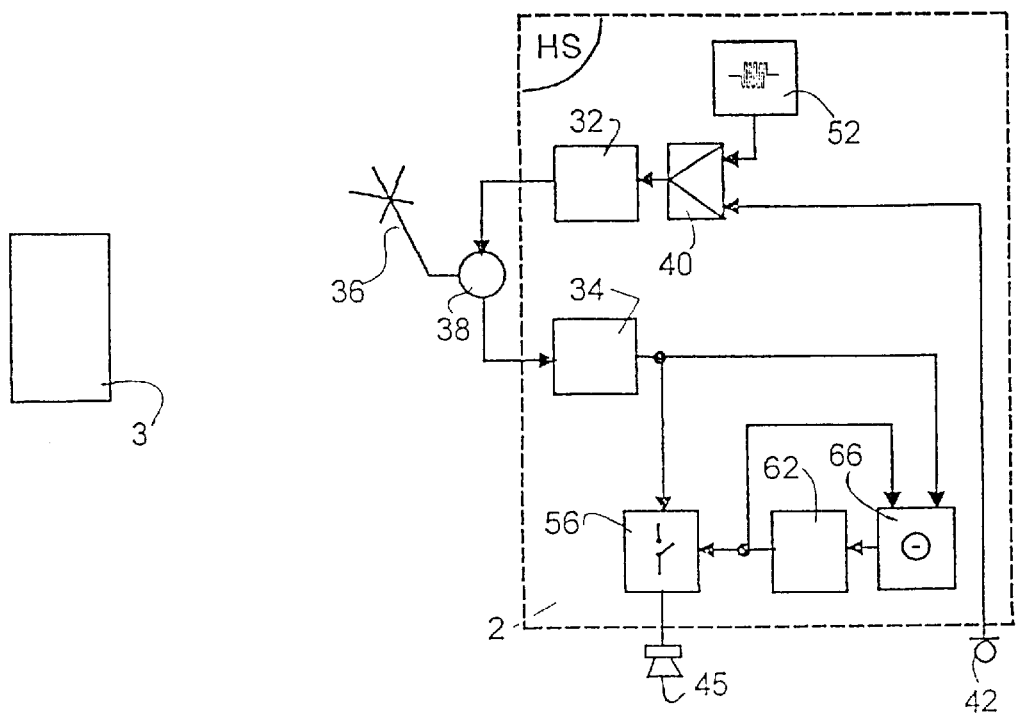
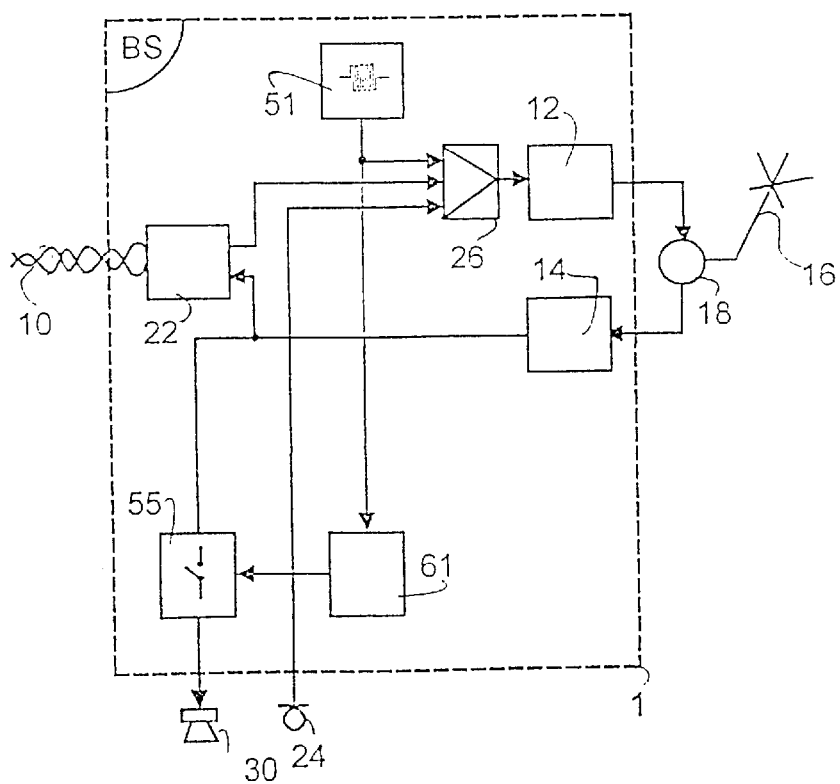
FIG. 1

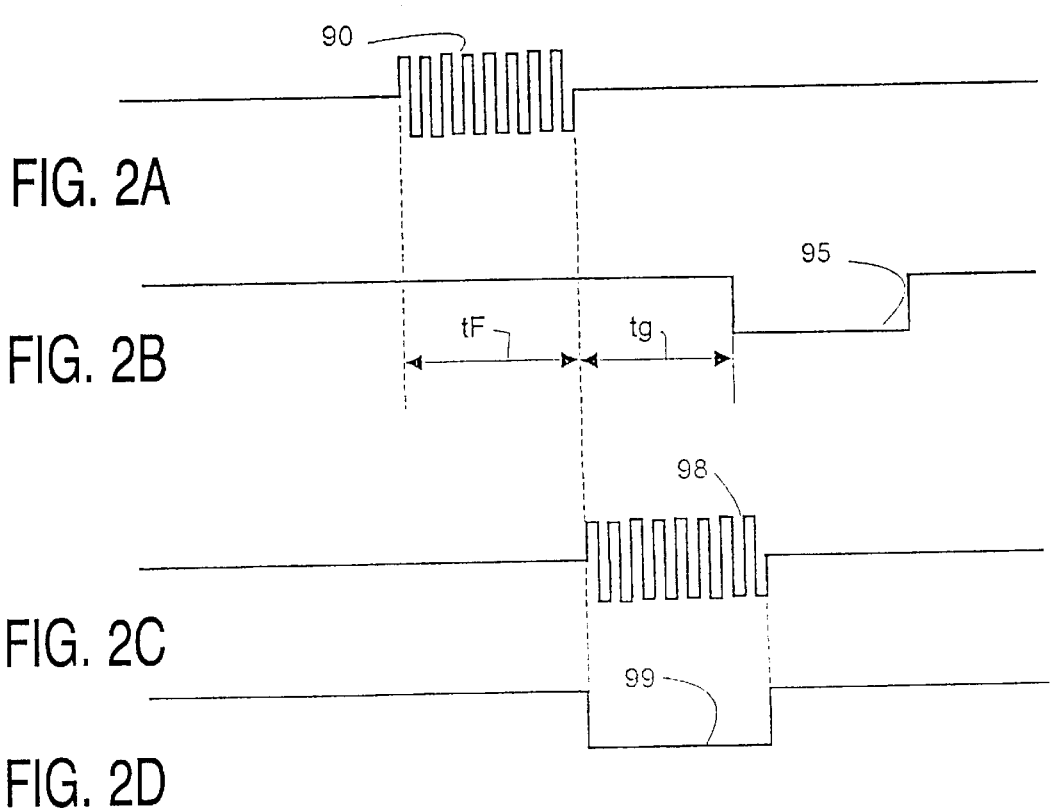

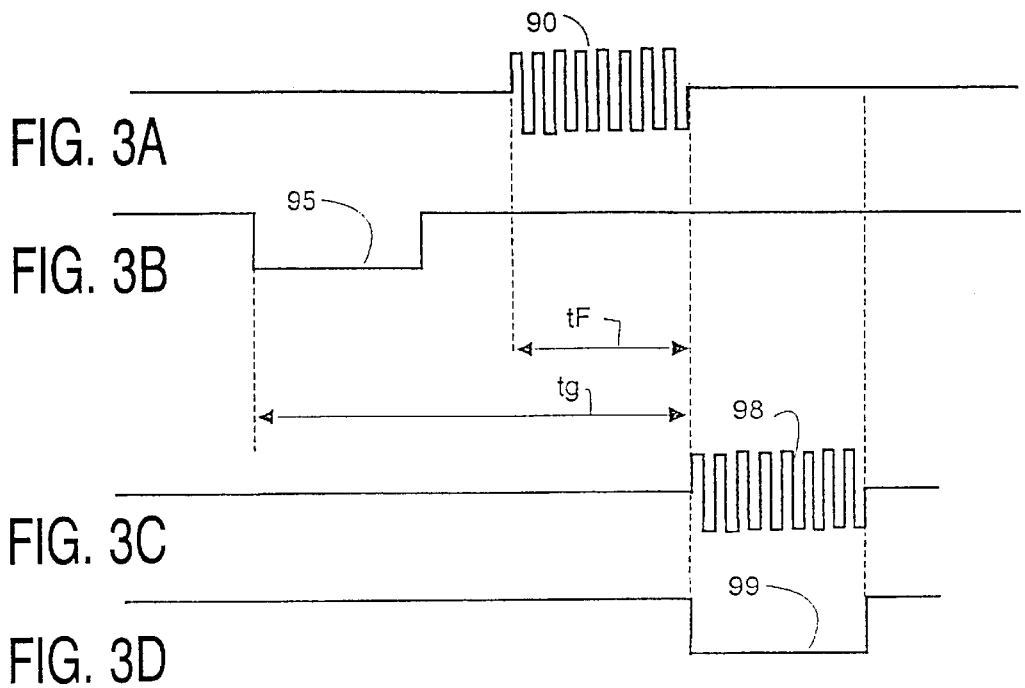
FIG. 3A
FIG. 3B
FIG. 3C
FIG. 3D
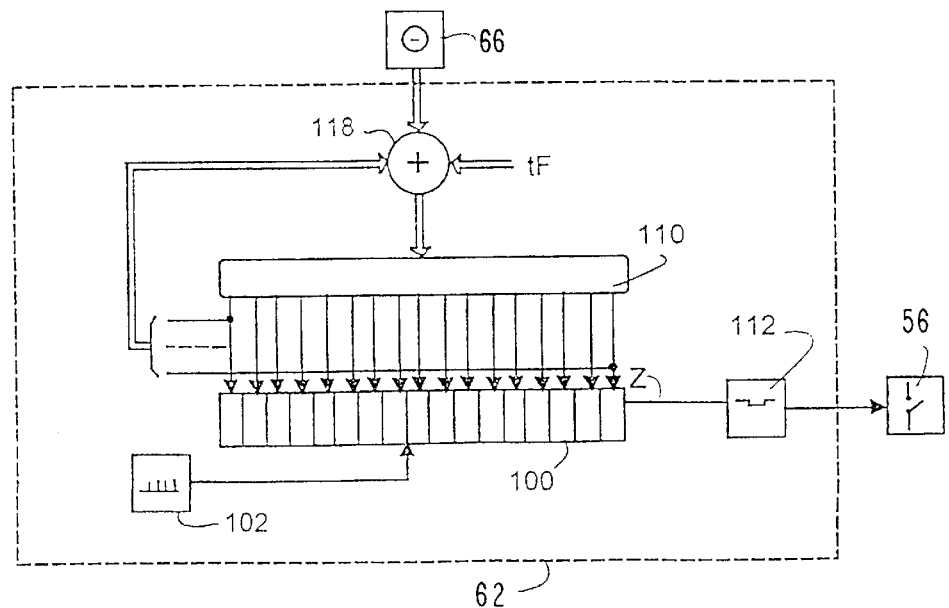
FIG. 4

TELEPHONE SYSTEM COMPRISING A BASE STATION AND AT LEAST ONE HANDSET, METHOD IMPLEMENTED IN SUCH A SYSTEM, SUBSCRIBER STATION AND BASE STATION SUITABLE FOR SUCH A SYSTEM

FIELD OF THE INVENTION

The invention relates to a telephone system comprising a base station and at least one handset, for permitting the exchange of call signals, the system having:
  means for transmitting signal frames superposed on call signals between the base station and the handset,
  means for cutting off the call signals during the reception of the signal frames.

The invention also relates to a method of cutting off the call signals during the signal frames, to a handset and to a base station suitable for such a system.

BACKGROUND OF THE INVENTION

Such systems are well known and the invention more particularly relates to cordless telephony devices known by the name of CT0, CT1, . . . , CTx.

One of the problems posed with this type of system is due to the necessity of periodically verifying whether the handset and the base station are validly interconnected. For this purpose, an identification code is transmitted in a signal frame. This transmission of a frame is superposed on the call signals which is highly annoying to the listeners. There is also proposed to reduce the perception of call signals during the transmission of these signal frames. However, as a result of the drift of the circuits, it is not always possible to ensure the simultaneity of the reception of the frames with the cutting off of the call signals and this calls forth an annoying effect for the user, because these frames carry unpleasant noise when listening.

SUMMARY OF THE INVENTION

The present invention proposes a system of the kind defined in the opening paragraph which permits of ensuring this simultaneity of these frame signals and the cutting off.

Therefore, such a system is characterized in that there are provided:
  a differential circuit for measuring the time interval between the cutting off of the call signals and the reception of said signal frame, and
  a correction circuit for modifying the appearance of said cutting off as a function of said difference.

BRIEF DESCRIPTION OF THE DRAWINGS

These and other aspects of the invention will be apparent from and elucidated with reference to the embodiments described hereinafter.

In the drawings:

FIG. 1 shows a system in accordance with the invention;

FIGS. 2A–2D show timing diagrams explaining the invention;

FIGS. 3A–3D show further timing diagrams explaining the invention; and

FIG. 4 shows the detail of embodiment of the control circuit which forms part of the system according to the invention.

DETAILED DESCRIPTION OF THE INVENTION

In FIG. 1 is diagrammatically shown the system according to the invention. It comprises a base station (BS) 1 and a certain number of handsets 2 and 3. In the described example, the system comprises two handsets, it may actually comprise a single handset and in other cases more than two. In FIG. 1 only the structure of the handset (HS) 2 is shown, the handset 3 may have an identical structure.

The base station 1 is connected, on the one hand, to a telephone line 10 and, on the other hand, by radio, to the handsets 2 and 3. This radio link is realized by means of a transmitter 12 and a receiver 14 which transmit and receive waves via an antenna 16. A coupling circuit 18 makes it possible for this transmitter 12 and receiver 14 to utilize this same antenna 16. The transmitter may transmit call signals originating either from the telephone line 10 via a hybrid circuit 22 or from a microphone 24. A switch circuit 26 permits of the selection of the data to be transmitted by the transmitter 12. The data received by the receiver 14 may be directed to a loudspeaker 30 and/or to the telephone line 10.

Similarly, the handset comprises a transmitter 32 and a receiver 34 which use the same antenna 36 via a coupling circuit 38. The transmitter 32 transmits the selected data via a switch circuit 40, notably call signals coming from a microphone 42. The receiver 34 supplies data notably to the loudspeaker 45 (or to an earphone).

For the purpose of mutual recognition, the base station and the handset periodically transmit signal frames in which identification codes are transmitted. Generators of such frames are provided both in the base station 1 and in the handset 2 and are referenced 51 and 52 respectively. These frames are superposed on the call signals and are experienced as background noise by the user as has already been observed. When these frames are received, the connection to the loudspeakers 30 and 45 is cut off by means of a switch circuit 55 and 56. The open or closed state of these switch circuits 55 and 56 determined by control circuits 61 and 62.

Within the scope of the described example, the frames are periodically transmitted, initiated by the base station 1 and the handset transmits its frame the moment it has received the frame from the base station. The control circuit 61 determines the closing of the switch circuit the moment it has detected the transmission of the frame produced by the generator 51.

On the other hand, according to one aspect of the invention a differential circuit 66 which determines the difference between the instant at which the connection is cut off and the received frame is provided for controlling the control circuit 62. Thus, this differential circuit permits of the correction of the drift of the occurrence of the cutting off of the speech channel.

In FIGS. 2A–2D are shown a first timing diagram explaining the invention.

Reference 90 in FIG. 2A shows the signal frame transmitted from the base station (BS) 1 which is considered the master station, which is to say that this is the station that initiates the signal exchange. Reference 95 in FIG. 2B shows the open state of the switch circuit 56 which forms part of the handset 2 considered the slave. It is the opening signal that undergoes the effects of drift stated earlier. Owing to these effects, this signal may occur for a period of time independent of the reception of frame signals 90. FIG. 2B shows the case where this opening signal (95) occurs after the reception of the frame signal 90, either after an instant tF+tg after the start of the signal transmitted by the master station (BS) where "tF" is the duration, defined by structure, of the frame and "tg+tF" defines the time drift one wishes to correct. FIG. 2C shows the transmission of a frame signal 98 which occurs immediately after the frame signal 95 has been received. This signal 98 is transmitted by the generator 52. The line D shows the opening signal 99 of the switch circuit 55 which can be easily synchronized with the signal transmitted by the generator 51.

FIGS. 3A–3D which are a second timing diagram, shows the case where the opening period occurs before the frame signal 90.

According to the invention the time "tg" is defined. A correction is thus to be made by advancing the appearance of the opening period by tF+tg for the case of FIGS. 2A–2D. For the case of FIGS. 3A–3D, a delay of tg–tF is to be provided.

FIG. 4 shows the structure of the control circuit 62. This control circuit 62 is formed by a counter circuit in this case, within the scope of the described example, a down-counter 100 counting down the pulses of a clock 102. One position of this down-counter, the zero-crossing, produces a signal on the output Z and causes this down-counter to be loaded by a digital value contained in a register 110. This zero-crossing also triggers a flip-flop circuit 112 which finally produces the signal for causing the switch 56 to open. A digital adder 118 provides the addition of the contents of the register 110 to the value determined by the differential circuit 66. As the detection of the signal frames occurs after its appearance, the adder 118 adds the value "tF". Thus, the invention provides a correction of the drift of the clock 102.

Obviously, any other embodiment of the circuit 62, notably in a software mode will be brought back to the scope of the invention. Furthermore, the role of master and slave may be reversed. That is to say, the handset may be considered master and the base station slave.

What is claimed is:

1. A telephone system comprising a base station and at least one handset, for permitting the exchange of call signals, the system having:
   means for transmitting signal frames superposed on call signals between the base station and the handset,
   means for cutting off the call signals during the reception of the signal frames,
   a differential circuit for measuring a difference of time interval between cutting off of the call signals and reception of said signal frame, and
   a correction circuit for modifying appearance of said cutting off as a function of said difference, wherein said differential circuit and said correction circuit are included in a unit that receives said signal frames, said unit being one of said base station and said at least one handset that receives said signal frames.

2. A system as claimed in claim 1, characterized in that the correction circuit is formed by a counter circuit whose contents vary as a function of the output signals of the difference circuit and of which one position produces the start of the cut-off signal.

3. A method implemented in a system as claimed in claim 1 for cutting off the call signals during the signal frames, characterized in that it comprises the following steps:
   determining the time difference between the cutting off and the appearance of said frame,
   correction of the cut off time as a function of said determination.

4. A subscriber device suitable for a system as claimed in claim 1, characterized in that it has:
   a differential circuit for measuring the time interval between the cutting off of the call signals and the reception of said signal frame,
   a correction circuit for modifying the appearance of said cutting off as a function of said difference.

5. A base station suitable for a system as claimed in claim 1, characterized in that it comprises:
   a differential circuit for measuring the time interval between the cutting off of the call signals and the reception of said signal frame,
   a correction circuit for modifying the appearance of said cutting off as a function of said difference.

6. A wireless communication system comprising:
   a master station; and
   a slave station;
   said master station and said slave station exchanging identification signals and call signals, and including means for cutting off said call signals during reception of said identification signals;
   wherein said means of said master station generates a master cut-off signal after transmission of a master identification signal to said slave station;
   said slave station transmitting to said master station a slave identification signal in response to reception of said master identification signal so that said master cut-off signal is aligned with said slave identification signal received by said master station; and
   wherein said means of said slave station generates a slave cut-off signal for alignment with said reception of said master identification signal;
   said slave station including a differential circuit for measuring a time interval between said slave cut-off signal and said master identification signal received by said slave station; and
   a correction circuit for changing said slave cut-off signal as a function of said time interval to provide said alignment.

7. A wireless communication unit being a slave station for communication through a master station comprising:
   a differential circuit; and
   a correction circuit;
   said master station and said slave station exchanging identification signals and call signals, and including means for cutting off said call signals during reception of said identification signals;
   wherein said means of said master station generates a master cut-off signal after transmission of a master identification signal to said slave station;
   said slave station transmitting to said master station a slave identification signal in response to reception of said master identification signal so that said master cut-off signal is aligned with said slave identification signal received by said master station; and
   wherein said means of said slave station generates a slave cut-off signal for alignment with said reception of said master identification signal;
   said differential circuit measuring a time interval between said slave cut-off signal and said master identification signal received by said slave station; and
   said correction circuit changing said slave cut-off signal as a function of said time interval to provide said alignment.

* * * * *